US007545698B2

(12) United States Patent
Safvi et al.

(10) Patent No.: US 7,545,698 B2
(45) Date of Patent: Jun. 9, 2009

(54) MEMORY TEST MODE FOR CHARGE RETENTION TESTING

(75) Inventors: Anwar Safvi, Rancho Murieta, CA (US); Reza Jazayeri, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 33 days.

(21) Appl. No.: 11/770,575

(22) Filed: Jun. 28, 2007

(65) Prior Publication Data

US 2009/0003099 A1 Jan. 1, 2009

(51) Int. Cl.
*G11C 7/00* (2006.01)
(52) U.S. Cl. .................................... 365/222; 365/201
(58) Field of Classification Search .............. 365/222, 365/201
See application file for complete search history.

(56) References Cited

U.S. PATENT DOCUMENTS

| 6,683,372 | B1 | 1/2004 | Wong et al. | |
|---|---|---|---|---|
| 6,781,908 | B1* | 8/2004 | Pelley et al. | 365/222 |
| 6,940,774 | B2* | 9/2005 | Perner | 365/222 |
| 2002/0199056 | A1 | 12/2002 | Ayukawa et al. | |
| 2004/0160838 | A1 | 8/2004 | Pelley et al. | |
| 2004/0233706 | A1 | 11/2004 | Burgan | |
| 2004/0240299 | A1* | 12/2004 | Fujimoto et al. | 365/222 |
| 2005/0169083 | A1* | 8/2005 | Riho et al. | 365/222 |
| 2006/0010350 | A1 | 1/2006 | Pelley et al. | |
| 2006/0083094 | A1 | 4/2006 | Sinha et al. | |
| 2006/0114734 | A1 | 6/2006 | Cruz et al. | |
| 2007/0083491 | A1 | 4/2007 | Walmsley et al. | |

OTHER PUBLICATIONS

U.S. Appl. No. 11/729,056, filed Mar. 28, 2007, entitled "Design for Test Feature to Improve DRAM Charge Retention Yield", invented by R. Jazayeri.
Wikipedia, "Dynamic Random Access Memory", [online], updated on May 8, 2007, [retrieved on May 9, 2007], retrieved from the Internet at <URL: http://en.wikipedia.org/wiki/Dynamic_random_access_memory>, 10 pp.
Wikipedia, "Memory Refresh", [online], updated on Nov. 19, 2005, [retrieved on May 9, 2007], retrieved from the Internet at <URL: http://en.wikipedia.org/wiki/Memory_refresh>, 1 pg.
International Search Report and Written Opinion, Jun. 26, 2008, for International Application No. PCT/US2008/058143, 13 pp.

* cited by examiner

*Primary Examiner*—Vu A Le
(74) *Attorney, Agent, or Firm*—Konrad Raynes & Victor LLP

(57) ABSTRACT

One embodiment includes a dynamic memory operable in different refresh modes including an autonomous refresh mode in which the refresh rate is set by an internal self refresh timer circuit on the memory circuit die, and a test refresh mode in which the refresh rate is set by a timer circuit external to the memory circuit die. Other embodiments are described and claimed.

14 Claims, 4 Drawing Sheets

MEMORY TEST MODE FOR CHARGE RETENTION TESTING

BACKGROUND

Description of Related Art

FIG. 1 shows an example of a known package-to-package stack indicated generally at 10. The stack 10 includes a first integrated circuit package 12, and a second integrated circuit package 14 which are physically and electrically connected together as shown using an interposer 16, for example. The stack 10 may form a system such as a computer system including a central processing unit, controllers and memory including dynamic random access memory (DRAM), which are disposed in the form of integrated circuits on the various dies 22, 25, 28 of the stack. A stack of interconnected dies may also form, for example, a memory system which includes for example, a flash memory die interconnected with a DRAM die which are packaged together.

FIG. 2 shows a schematic diagram of an example of a known dynamic random access memory (DRAM) circuit 40 which may be disposed on a die such as the die 25, for example. A refresh signal generation circuit 44 refreshes the memory cells of an array 46 in response to refresh trigger signals output by a self refresh timer circuit 42 which may include a crystal. The self refresh rate is typically fixed at a particular frequency by the self refresh timer circuit 42 of the DRAM circuit 40. In this manner, the DRAM circuit 40 refreshes itself autonomously at a rate set by the DRAM circuit 40 itself.

In response to each trigger signal from the self refresh trigger circuit 42, the refresh signal generation circuit 44 typically refreshes one row of the memory cell array 46 at an address indicated by a refresh address counter 48 of the refresh signal generation circuit 44. In some known devices, the row address counter of refresh circuitry may be located in logic circuitry external to the DRAM die.

BRIEF DESCRIPTION OF THE DRAWINGS

Referring now to the drawings in which like reference numbers represent corresponding parts throughout.

DETAILED DESCRIPTION OF THE ILLUSTRATED EMBODIMENTS

In the following description, reference is made to the accompanying drawings which form a part hereof and which illustrate several embodiments of the present disclosure. It is understood that other embodiments may be utilized and structural and operational changes may be made without departing from the scope of the present description.

Figure 3:
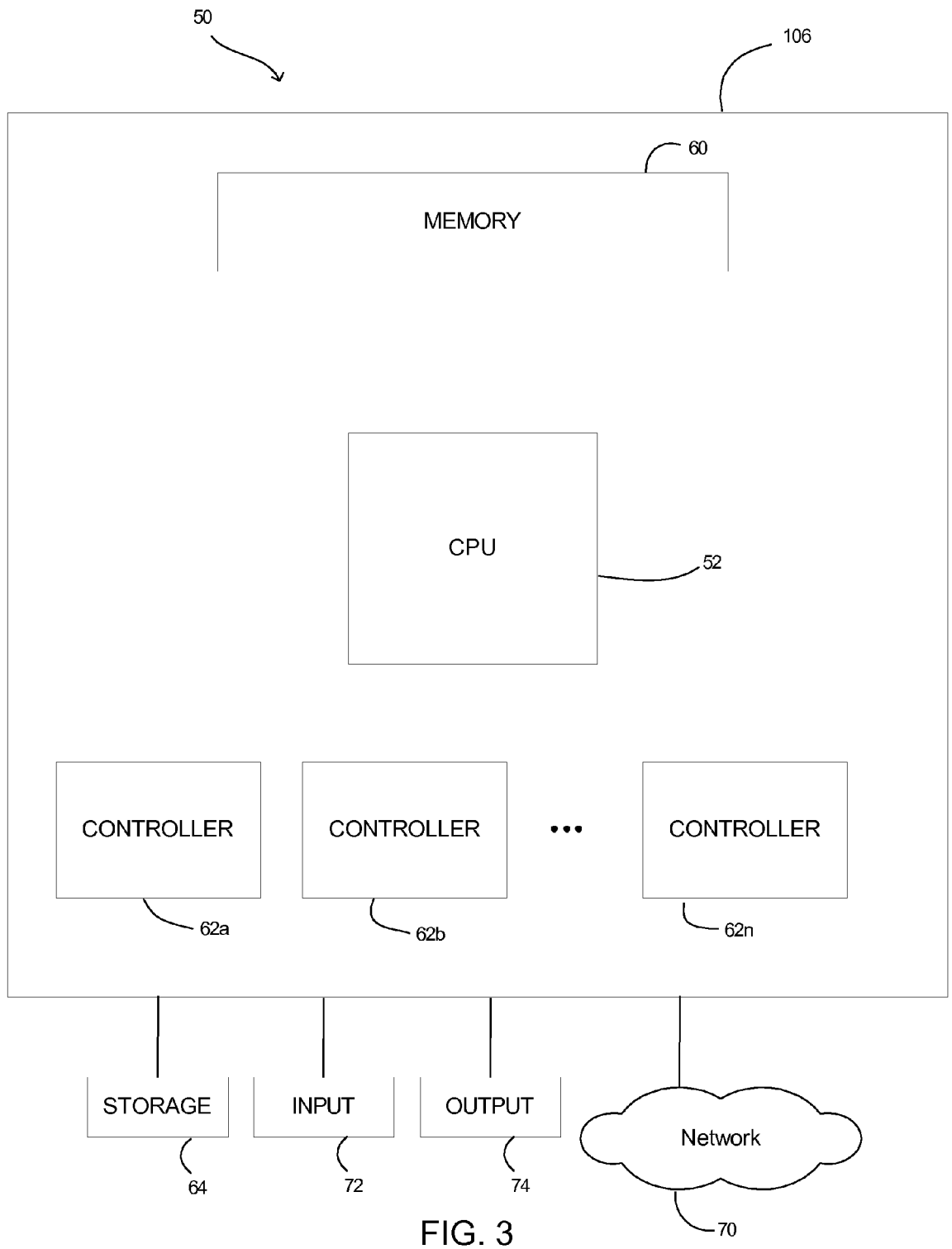
FIG. 3 illustrates one embodiment of a computing environment in which aspects of the description provided herein are embodied.
Figure 4:
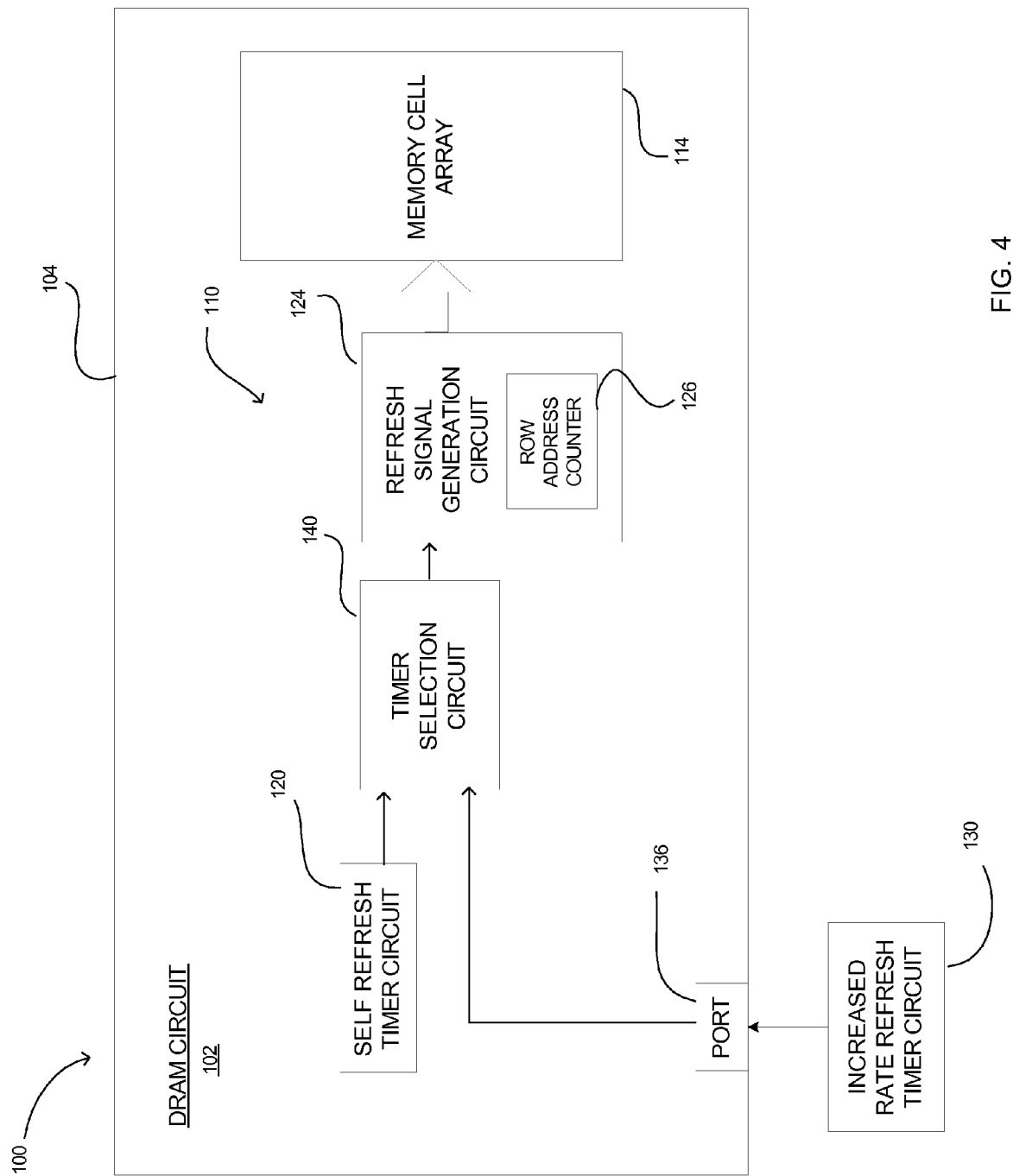
FIG. 4 illustrates one example of a schematic diagram of a memory circuit having a test mode in accordance with one aspect of the present description.

FIG. 3 illustrates an example of a computing environment in which aspects of described embodiments may be embodied. A computer 50 includes one or more central processing units (CPU) 52 (only one is shown), a memory 60 (e.g., a volatile memory device), and a plurality of controllers 62a, 62b . . . 62n. Each of the CPU 52, memory 60 and controllers 62a, 62b . . . 62n include one or more electronic devices. Once such electronic device is represented by an electronic device 100 (FIG. 4) which includes a volatile memory circuit 102 disposed on an integrated circuit die 104 which is electrically and mechanically coupled to a printed circuit board 106.

The volatile memory circuit 102 may be a dynamic random access memory which is a type of memory that typically stores each bit of data in a separate capacitor within an integrated circuit. Because capacitors typically leak charge, the information stored in the memory can eventually fade unless the capacitor charge is refreshed periodically. However, if the refresh rate is set too high, excessive power consumption can occur.

The charge retention time of DRAM based products is typically temperature sensitive. For example, a 10° C. increase in the junction temperature of the DRAM circuit may reduce its charge retention time by up to 50%. As a result, if a DRAM circuit is tested at too high a temperature, the DRAM circuit may fail the test notwithstanding that the DRAM circuit is a good device. Such false failures are often referred to as "overkill." In Stacked-Chip Scale Packages (SCSP) where flash memory, processors or other devices may be stacked with DRAM based products, the DRAM yield may be of particular interest because a failing DRAM die can cause the entire package to fail the test, which can result in the loss of an otherwise good flash memory, or processor, or both.

Due to variations in test equipment, die requirements, test conditions and other factors, and due to the requirements of high volume testing, it is often difficult to test a DRAM circuit at an optimum test temperature. As a consequence, the overkill rate may be excessive in tests which depend upon the charge retention capabilities of the DRAM circuit.

In accordance with one aspect of the present description, the memory circuit 102 of the device 100 of this embodiment includes a refresh circuit 110 which is adapted to selectively refresh memory cells of a memory cell array 114 at a first rate in a first mode, and refresh memory cells at another, faster rate in a test mode in which the test mode refresh rate may be readily determined by an external timer circuit 130. As explained in greater detail below, it is believed that such an arrangement can significantly reduce occurrences of overkill in testing related to memory charge retention. It is appreciated that in other applications, features other than testing overkill reduction may be realized in addition thereto or instead of, in utilizing a memory refresh test mode in accordance with the present description.

Figure 1:
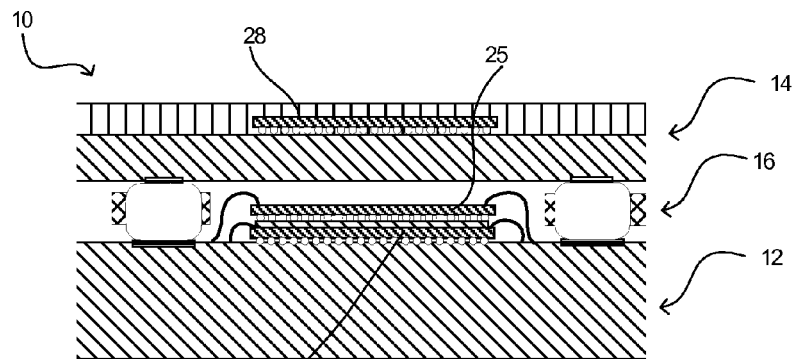
FIG. 1 schematically illustrates a prior art integrated circuit device having a plurality of stacked integrated circuit dies.
Figure 2:
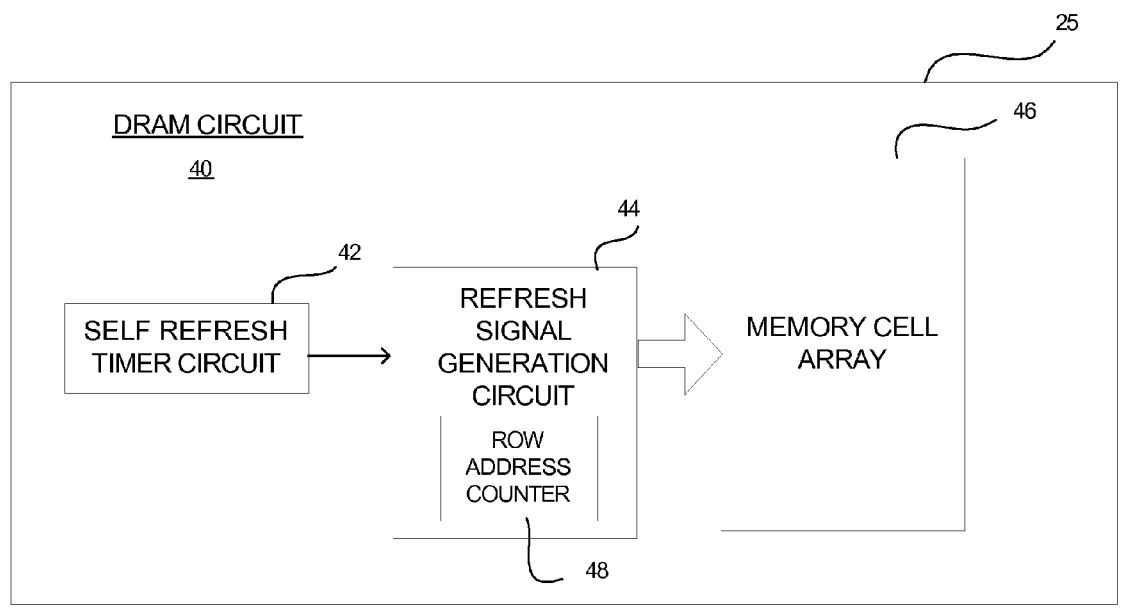
FIG. 2 illustrates a prior art memory circuit having a self refresh circuit for autonomously refreshing memory cells of the circuit.

The printed circuit board 106 (FIG. 2) may be a single layer or multi-layered motherboard which has a plurality of conductive lines that provide communication between the circuits in the device 100 and other components mounted to the board 106. Alternatively, one or more of the CPU 52, memory 60 and controllers 62a, 62b . . . 62n may be disposed on other cards such as daughter cards or expansion cards.

An operating system and various applications execute on the CPU 52 and reside in the memory 60. The content residing in memory 60 may be cached in accordance with appropriate caching techniques. Programs and data in memory 60 may be swapped into storage 64 (e.g., a non-volatile storage, such as magnetic disk drives, optical disk drives, a tape drive, etc.) as part of memory management operations. The computer 50 may comprise any computing device, such as a mainframe, server, personal computer, workstation, laptop, handheld computer, telephony device, network appliance, virtualization device, storage controller, network controller, etc.

Any suitable CPU 52 and operating system may be used. For example, CPU 52 may represent any of a wide variety of control logic including, but not limited to one or more of a microprocessor, a programmable logic device (PLD), programmable logic array (PLA), application specific integrated circuit (ASIC), a microcontroller, and the like, although the present description is not limited in this respect. In one embodiment, CPU 52 includes one or more Intel® compatible processors. Processors of CPU 52 may have an instruction set containing a plurality of machine level instructions that may be invoked, for example by an application or operating system.

The controllers 62a, 62b . . . 62n may include a system controller, peripheral controller, memory controller, hub controller, I/O bus controller, video controller, network controller, storage controller, etc. For example, a storage controller can control the reading of data from and the writing of data to the storage 64 in accordance with a storage protocol layer. The storage protocol of the layer may be any of a number of suitable storage protocols. Data being written to or read from the storage 64 may be cached in accordance with appropriate caching techniques.

A network controller can include one or more protocol layers to send and receive network packets to and from remote devices over a network 70. The network 70 may comprise a Local Area Network (LAN), the Internet, a Wide Area Network (WAN), Storage Area Network (SAN), etc. Embodiments may be configured to transmit data over a wireless network or connection. In certain embodiments, the network controller and various protocol layers may employ the Ethernet protocol over unshielded twisted pair cable, token ring protocol, Fibre Channel protocol, etc., or any other suitable network communication protocol. In some embodiments, the computer 50 may not be connected to a network 70 or may lack storage 64.

A video controller can render information on a display monitor, and may be embodied on a video card or integrated on integrated circuit components mounted on the motherboard. Certain of the devices may have multiple cards or controllers. An input device 72 is used to provide user input to the computer 50, and may include a keyboard, mouse, penstylus, microphone, touch sensitive display screen, or any other suitable activation or input mechanism. An output device 74 is capable of rendering information transmitted from the processor CPU 52, or other component, such as a display monitor, printer, storage, etc.

In certain embodiments, the memory test mode embodiments may be embodied in a computer system including a video controller to render information to display on a monitor coupled to a computer system comprising a desktop, workstation, server, mainframe, laptop, handheld computer, etc. Alternatively, the memory test mode embodiments may be embodied in a computing device that does not include a video controller, such as a switch, router, etc.

A network controller or other devices described herein may be mounted on an expansion card, such as a Peripheral Component Interconnect (PCI) card, PCI-express or some other I/O expansion card coupled to a motherboard, or on integrated circuit components mounted on the motherboard. Integrated circuit dies may be packaged individually, or packaged with other dies in stacks or other arrangements within a package. Thus, memory test mode embodiments may be embodied in computer systems or other systems in which a dynamic random access memory having a test mode in accordance with the present description is mounted on one or both of a motherboard and an expansion card. Accordingly, in some system embodiments, the system may lack an expansion card, and a test mode memory in accordance with the present description may be mounted on a motherboard. In another system embodiment, a test mode memory accordance with the present description may be mounted on an expansion card but not on a motherboard.

Details on the PCI architecture are described in "PCI Local Bus, Rev. 2.3", published by the PCI-SIG. Details on the Fibre Channel architecture are described in the technology specification "Fibre Channel Framing and Signaling Interface", document no. ISO/IEC AWI 14165-25. Details on the Ethernet protocol are described in publications including "IEEE std. 802.3," published Mar. 8, 2002, and "IEEE std. 802.11," published 1999-2003.

In the illustrated embodiment, the refresh circuit 110 includes a self timer circuit 120 and a refresh signal generation circuit 124 disposed on the same die 104 as the memory cell array 114. In a manner similar to the DRAM circuit 40 discussed above, the refresh signal generation circuit 124 is adapted to refresh the memory cells of the array 114 autonomously in response to the self refresh timer circuit 120 of the die 104 at a rate set by the self refresh timer circuit 120 during one mode of operation, which is referred to herein as the self refresh or autonomous refresh mode. In this mode, the self refresh timer circuit 120 initiates a self refresh trigger signal. In response to this trigger, the refresh signal generation circuit 124 refreshes one row of the memory array 114 at an address indicated by a refresh address counter 126. After each row is refreshed, the refresh address counter 126 is incremented so that the next row of the array 114 may be refreshed in response to the next trigger from the self refresh timer circuit 120. Thus, for example, if the memory cell array 114 has 100 rows and the self refresh timer circuit 120 triggers a refresh event every 1 ms (millisecond,) the entire memory array 114 is refreshed in 100 ms (i.e. the memory array is refreshed with a frequency of 10 Hz.)

This first autonomous refresh mode may be the standard operational mode in which the DRAM circuit 102 is operated in normal memory operations. Also, the DRAM circuit 102 may be tested in this mode, particularly for test results which are not sensitive to the charge retention capabilities of the DRAM circuit 102.

In accordance with one aspect of the present description, the refresh circuit 110 further includes a refresh timer circuit 130 external to the die 104, and a port 136 disposed on the die 104, and adapted to be coupled to the external timer circuit 130. During a second mode, referred to herein as the test mode, the refresh signal generation circuit 124 is adapted to generate refreshing signals for refreshing the memory cells in response to refresh triggers provided by the external timer circuit 130. Thus, during the second mode or test mode, the refresh rate is determined by the timer circuit 130 external to the die.

In accordance with one aspect of the present description, the refresh rate provided by the external timer circuit may be readily set a particular rate which can be appropriately higher than the refresh rate of the first or autonomous mode. It is believed that such a higher refresh rate during the test mode can compensate for the effects of increased temperature which may be experienced by the DRAM circuit 102 during testing. Accordingly, it is believed that overkill during charge retention based testing can be reduced or eliminated.

Once the particular test has been completed, the mode of the DRAM circuit 102 may be reset to the autonomous refresh mode. Since the autonomous mode refresh rate can be set lower than the test mode refresh rate, excessive power consumption during normal operation may be reduced or eliminated.

In the illustrated embodiment, the refresh circuit 110 further includes a timer selection circuit 140 disposed on the die and adapted to disconnect the self timer circuit 120 from the refresh generation circuit 124 in response to a test mode enable signal. In addition, the timer selection circuit 140 is adapted to couple the port 136 and hence the external timer circuit 130, to the refresh generation circuit 124 in response to the test mode enable signal. In this manner, the refresh rate during the second or test mode may be determined by the timer circuit 130 external to the die 104 instead of the self refresh timer circuit 120 on board the die 104.

In the illustrated embodiment, the port 136 may include an external input pin such as an address pin such as address bit A0, for example. It is appreciated that other input pins may be utilized as well. Utilizing an external timer circuit may facilitate adjusting the refresh rate during the second or test mode.

DRAM memory array 114 represents any type of volatile memory used to store data or instructions. In one embodiment, DRAM memory array 114 may include of Rambus DRAM (RDRAM). In another embodiment, for example, DRAM memory array 114 may include double data rate synchronous DRAM (DDRSDRAM). In yet another embodiment, the array 114 may include a pseudo static RAM (PSRAM). Other dynamic or volatile memories may be utilized, depending upon the particular application.

Figure 5:
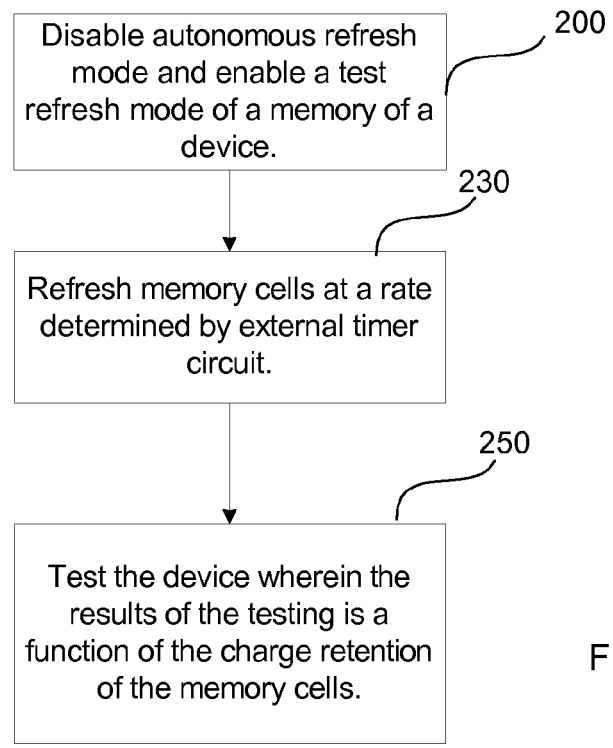
FIG. 5 is a flow chart depicting one example of operations for refreshing memory cells of a memory circuit in a test mode in accordance with one embodiment of the present description.
Figure 6:
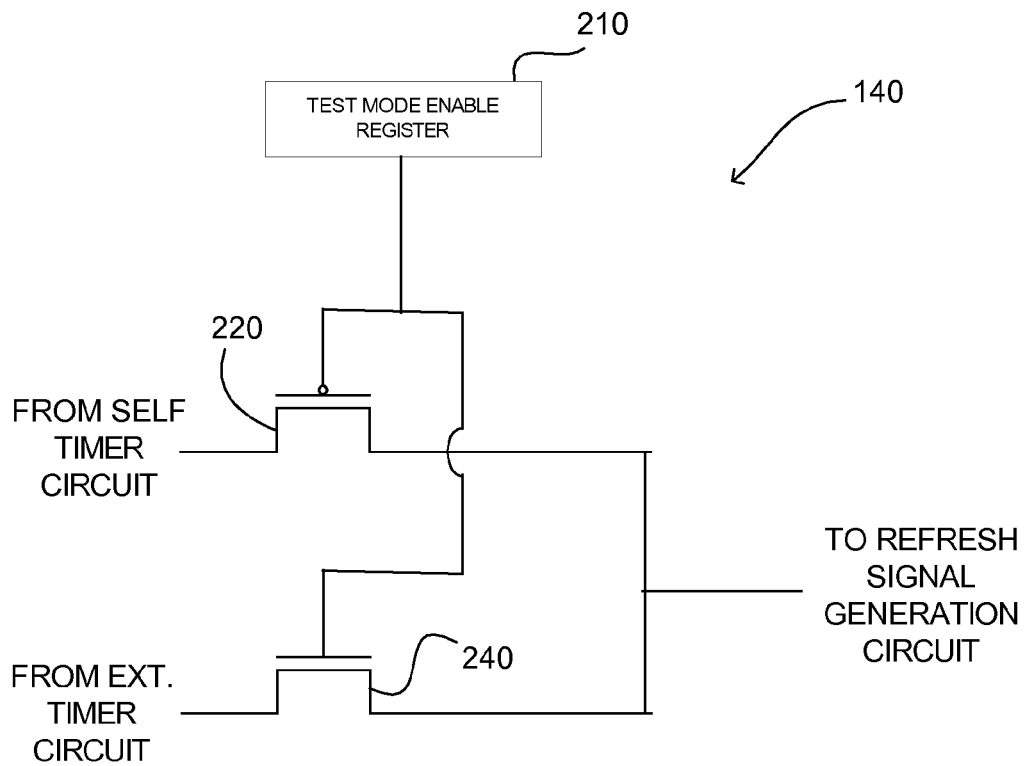
FIG. 6 is one example of a timer selection circuit for a memory circuit in accordance with one aspect of the present description.

FIG. 5 shows one example of operations to test a device such as a multiple die package which includes various integrated circuits interconnected as a system including for example, a processor or a flash memory, and a volatile memory such as the DRAM circuit 102, for example. In one operation, the autonomous refresh mode is disabled and a test mode is enabled (block 200). In the illustrated embodiment, the autonomous refresh mode is disabled and the test refresh mode is enabled by setting contents of a control register 210 (FIG. 6) of the timer selection circuit 140 on the die 104. A switching transistor 220 in response to the test mode enable/ autonomous mode disable signal stored in the contents of the control register 210, turns off, thereby disconnecting the refresh trigger signals of the output of the self timer circuit 120 (FIG. 4) from the trigger signal input of the refresh signal generation circuit 124.

During the test mode, the memory cells of the DRAM circuit are refreshed (block 230) at a special test mode refresh rate which is determined by the external timer circuit and can be readily set by the test operator to an appropriate rate which can be higher than the normal autonomous refresh rate. In one embodiment, the test mode refresh rate may be 5-50% faster than the autonomous rate, for example, or 5-20% faster than the autonomous rate, for example. Thus, if the entire memory is refreshed every 100 ms in the autonomous refresh mode, the entire memory may be refreshed every 90 ms, for example, in the test refresh mode. It is appreciated that other refresh rates faster than the autonomous refresh rate may be utilized, depending upon the particular application.

In the illustrated embodiment, a switching transistor 240 in response to the test mode enable/autonomous mode disable signal stored in the contents of the control register 210, turns on, thereby connecting the port 136 and hence the trigger signals of the output of the external increased rate refresh timer circuit 130 (FIG. 4) to the trigger signal input of the refresh signal generation circuit 124 so that the memory cells of the DRAM circuit are refreshed at the increased rate provided by the trigger signals of the external timing circuit 130.

In another operation, the device is tested (block 250) in a test in which the results of the test depends upon the charge retention capabilities of the memory circuit of the device. Because of the increased refresh rate during the test mode, it is believed that any reduction in charge retention by the DRAM circuit 102 caused by increased testing temperatures may be adequately compensated. As a result, it is believed that testing overkill due to temperature caused charge retention reduction may be reduced or eliminated.

The higher refresh rate set by the external timer circuit may be fixed at a particular value for a particular type of memory or a particular type of test. Such a value may be obtained empirically or by calculation, depending upon the particular application. In other applications, the external timer circuit may readily provide a variable test mode refresh rate, which can vary depending upon the particular test being applied, the particular type of memory circuit being tested, the particular portion of a test being conducted or other factors, depending upon the particular application.

Once the particular test has been completed, the mode of the DRAM circuit 102 may be reset to the autonomous refresh mode. Since the autonomous mode refresh rate can be set lower than the test mode refresh rate, excessive power consumption during normal operation may be reduced or eliminated.

In the illustrated embodiment, the autonomous refresh mode is enabled and the test refresh mode is disabled by appropriately setting contents of the control register 210 (FIG. 6) of the timer selection circuit 140 on the die 104. The switching transistor 220 in response to the autonomous mode enable/test mode disable signal stored in the contents of the control register 210, turns on, thereby connecting the refresh trigger signals of the output of the self timer circuit 120 (FIG. 4) to the trigger signal input of the refresh signal generation circuit 124.

During the autonomous refresh mode, the memory cells of the DRAM circuit are refreshed at the autonomous mode refresh rate which is determined by the internal self refresh timer circuit which is typically fixed at manufacture of the circuit. However, it is appreciated that in some applications, the autonomous refresh rate at which the circuit refreshes itself internally may be controllable.

In the illustrated embodiment, the switching transistor 240 in response to the autonomous mode enable/test mode disable signal stored in the contents of the control register 210, turns off, thereby disconnecting the port 136 and hence the trigger signals of the output of the external increased rate refresh timer circuit 130 (FIG. 4) from the trigger signal input of the refresh signal generation circuit 124 so that the memory cells of the DRAM circuit are not refreshed at the test mode rate provided by the trigger signals of the external timing circuit 130.

ADDITIONAL EMBODIMENT DETAILS

The illustrated operations of FIG. 5 show certain events occurring in a certain order. In alternative embodiments, certain operations may be performed in a different order, modified or removed. Moreover, operations may be added to the above described operations and still conform to the described embodiments. Further, operations described herein may occur sequentially or certain operations may be processed in parallel.

The foregoing description of various embodiments has been presented for the purposes of illustration and explanation. It is not intended to be exhaustive or to limit to the precise form disclosed. Many modifications and variations are possible in light of the above teaching.

What is claimed is:

1. A method, comprising:
    disabling an autonomous refresh mode of a dynamic random access memory circuit on a die which is adapted to autonomously refresh the memory cells of the memory circuit at a first autonomous refresh mode rate;
    enabling a test refresh mode;
    refreshing said memory cells during said test refresh mode at a second test refresh mode rate which is higher than said first autonomous refresh mode rate and is a function of the output of a timer circuit external to the die of the memory circuit; and
    testing said memory circuit wherein the results of said testing is a function of the charge retention of said memory cells.

2. The method of claim 1 wherein said second rate is 5-50% faster than said first rate.

3. The method of claim 1 wherein said autonomous refresh mode disabling and said test refresh mode enabling includes setting contents of a control register on said die.

4. The method of claim 1 further comprising:
    disabling said test refresh mode;
    enabling said autonomous refresh mode; and
    refreshing said memory cells during said autonomous refresh mode at said first autonomous refresh mode rate which is lower than said second test refresh mode rate and is a function of the output of a self timer circuit on the die of the memory circuit.

5. The method of claim 4 wherein said autonomous mode refreshing includes generating refresh signals by a refresh signal generation circuit in response to refresh trigger signals output by a self timer circuit on said die during said autonomous mode refreshing, and wherein said first autonomous refresh rate is determined by the rate at which refresh trigger signals are output by said self timer circuit on said die.

6. The method of claim 5 wherein said test mode refreshing includes generating refresh signals by said refresh signal generation circuit in response to refresh trigger signals output by said external timer circuit during said test mode refreshing, and wherein said second test refresh rate is determined by the rate of at which refresh trigger signals are output by said external timer circuit.

7. The method of claim 6 wherein said autonomous refresh mode disabling includes disconnecting a refresh trigger signal output of said self timer circuit from a refresh trigger signal input of said refresh signal generation circuit and said test mode enabling includes connecting an external port to said refresh trigger signal input of said refresh signal generation circuit, wherein said port is adapted to receive refresh trigger signals output by said external timer circuit.

8. The method of claim 7 wherein said autonomous mode disabling and said test mode enabling includes setting a content of a control register on said die, and said disconnecting and connecting are in response to said control register content.

9. A device for use with an external timer circuit, comprising:
    a first die; and
    an integrated circuit comprising a dynamic random access memory circuit disposed on said die and having a plurality of memory cells; said integrated circuit further including a refresh signal generation circuit disposed on said die and adapted to refresh said memory cells in response to trigger signals, a self timer circuit adapted to provide a plurality of refresh trigger signals at a first rate; a port disposed on said die and adapted to receive a plurality of refresh trigger signals from said external timer circuit; and a timer selection circuit disposed on said die and adapted to, in response to a test mode enable signal, disconnect said self timer circuit from said refresh generation circuit during a test refresh mode, and to couple refresh trigger signals from said port to said refresh generation circuit, wherein said refresh signal generation circuit is adapted to refresh said memory cells at a second test mode rate in response to refresh trigger signals provided by said timer circuit external to said die during said test refresh mode.

10. The device of claim 9 wherein said timer selection circuit is adapted to, in response to an autonomous refresh mode enable signal, disconnect said port from said refresh signal generation circuit during an autonomous refresh mode, and to couple refresh trigger signals from said self timer circuit to said refresh signal generation circuit, wherein said refresh signal generation circuit is adapted to refresh said memory cells autonomously at said first refresh rate in response to refresh trigger signals provided by said self timer circuit during said autonomous refresh mode.

11. The device of claim 10 wherein said second test mode rate is 5-50% faster than said first autonomous refresh mode rate.

12. The device of claim 9 wherein integrated circuit on said die further includes a control register disposed on said die and adapted to store a refresh mode enable signal, and wherein said timer selection circuit is adapted to, in response to the contents of said control register to selectively couple refresh trigger signals from said self timer circuit to said refresh generation circuit during said first autonomous mode, to disconnect said self timer circuit from said refresh generation circuit during said test mode, and couple said port to said refresh generation circuit, during said test mode, wherein said second test mode rate is determined by said timer circuit external to said die.

13. The device of claim 9 further comprising a second die and a package within which said first and second dies are disposed, said second die having at least one integrated circuit which includes a central processing unit, said memory circuit of said first die being coupled to said central processing unit, and wherein said device is a computer system further comprising:
    a video controller coupled to said central processing unit;
    storage coupled to said central processing unit;
    an input device coupled to said central processing unit; and
    an output device coupled to said central processing unit.

14. The device of claim 9 further comprising a second die and a package within which said first and second dies are disposed, said second die having at least one integrated circuit which includes a flash memory.

* * * * *